United States Patent
Dean et al.

[11] Patent Number: 5,864,273
[45] Date of Patent: Jan. 26, 1999

[54] CRYOCOOLER VIBRATION ISOLATION AND NOISE REDUCTION IN MAGNETIC RESONANCE IMAGING

[75] Inventors: David E. Dean; Clifford J. Ginfrida, both of Florence, S.C.; Scott Thomas Mansell, Waterford, Wis.; Thomas M. Nixon, Florence, S.C.; Dewain A. Purgill, Waukesha; Michael James Radziun, Waterford, both of Wis.

[73] Assignee: General Electric Company, Milwaukee, Wis.

[21] Appl. No.: 814,909

[22] Filed: Mar. 12, 1997

[51] Int. Cl.⁶ ........................................ H01F 1/00
[52] U.S. Cl. .................... 335/216; 505/892; 62/51.1
[58] Field of Search ...................... 335/216, 299; 62/51.1, 51.2, 51.3, 297; 248/636.8; 505/892

[56] References Cited

U.S. PATENT DOCUMENTS

| 5,129,232 | 7/1992 | Minas et al. ........................... 62/51.1 |
| 5,317,879 | 6/1994 | Goldberg et al. ....................... 62/51.1 |
| 5,522,226 | 6/1996 | Mruzek .................................... 62/51.1 |
| 5,613,367 | 3/1997 | Chen ....................................... 62/47.1 |

FOREIGN PATENT DOCUMENTS

| 0359262 | 3/1990 | European Pat. Off. . |
| 0414443 | 2/1991 | European Pat. Off. . |
| 2272061 | 5/1994 | United Kingdom . |

*Primary Examiner*—Lincoln Donovan
*Attorney, Agent, or Firm*—Irving M. Freedman; Christian G. Cabou; Phyllis Y. Price

[57] ABSTRACT

Vibration and noise isolation for a magnetic resonance imager (MRI) superconducting magnet cryocooler includes a bellows between the cryocooler and its vacuum sleeve in the magnet, a mass suspended along the axis of, but at a distance from, the cryocooler, elastomeric blocks parallel to the axis, and braided copper wires connecting the vacuum sleeve and the heat shields of the MRI. Motion limiters and bellows flexures are provided for dynamic loads which might be encountered during transport of the magnet.

19 Claims, 3 Drawing Sheets

FIG_1

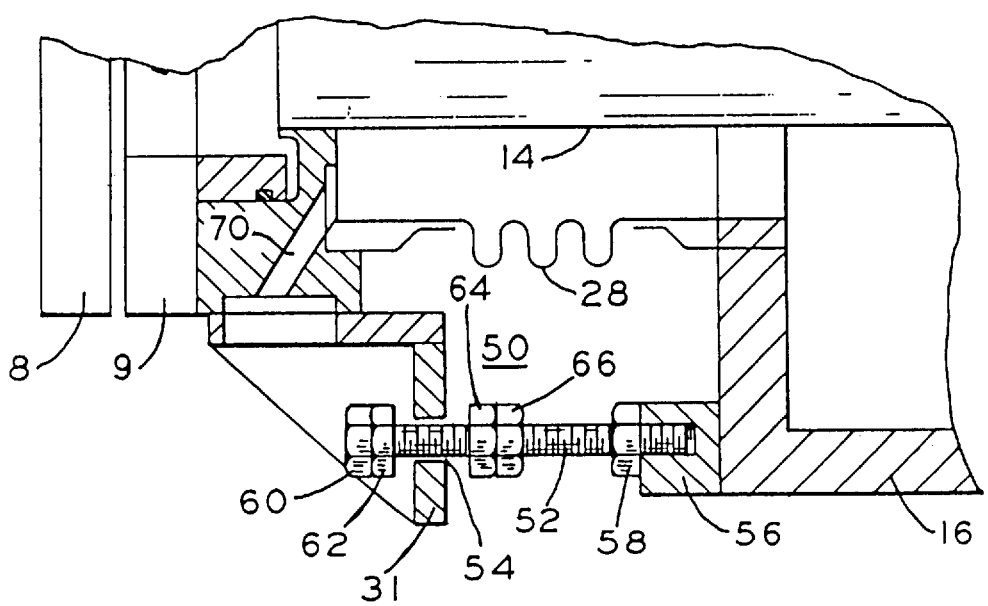
FIG_3

CRYOCOOLER VIBRATION ISOLATION AND NOISE REDUCTION IN MAGNETIC RESONANCE IMAGING

BACKGROUND OF INVENTION

This invention relates to the use of cryocoolers in superconducting magnets for magnetic resonance imaging (hereinafter "MRI"), and more particularly to noise reduction, and vibration isolation, of the cryocooler to improve the quality of the images provided by MRI operation.

As is well known, a magnet coil can be made superconducting by placing it in an extremely cold environment, such as by enclosing it in a cryostat or pressure vessel containing liquid helium or other cryogen. The extreme cold reduces the resistance of the magnet coil to negligible levels, such that when a power source is initially connected to the coil (for a period, for example, of 100 minutes) to introduce a current flow through the coil, the current will continue to flow through the coil due to the negligible coil resistance even after power is removed, thereby maintaining a strong magnetic field. Superconducting magnets find wide application, for example, in the field of MRI.

In a typical MRI superconducting magnet, the pressure vessel, which is contained within a vacuum vessel, is surrounded by a plurality of intermediate concentric heat shields. Each successive heat shield is at a slightly higher temperature than the cryogen in order to thermally isolate the pressure vessel from ambient temperatures on the outside of the vacuum vessel, which may be in the order to some 300° K. higher than the cryogen temperature. The thermal shields are maintained at their cold temperatures by a cryogenic refrigerator which typically is contained within a stainless steel cold head sleeve cylinder with thermal connections between the cold head and the thermal shields. The thermal connection between the cold head and the thermal shields must be thermally conductive and efficient, and operate in the presence of vibration generated by the movement of the piston and gas within the cryogenic refrigerator or cryocooler and the resultant movement of the cold head relative to the heat shields and relative to the superconducting magnet.

Considerable research has been directed at eliminating the need to continuously replenish the boiling helium with the associated problems of transporting and storing liquid helium. This has led to the further use of cryocoolers in recondensing apparatus used to recondense the helium gas back to liquid helium for reuse in providing the superconducting temperatures.

Cryocoolers have been found to provide two major problems, acoustic noise and vibration. The noise has proven to be nuisance and distraction to MRI operators and patients because of its disturbing frequency and the vibration has resulted in deterioration in the MRI image quality. An additional problem is minimizing noise and vibration without deterioration in the cryocooler performance.

U.S. Pat. No. 5,317,879 entitled, "Flexible Thermal Connection System Between A Cryogenic Refrigerator and An MRI Superconducting Magnet", assigned to the same assignee as the present invention, has helped particularly in reducing vibration transmitted to the thermal shields, but has not proven adequate in reducing cryocooler noise and vibration transmittal to the remainder of the superconducting magnet, particularly the vacuum vessel to which it is secured, and adequately reducing the acoustic noise generated by cryocooler operation.

OBJECTS AND SUMMARY OF THE INVENTION

It is an object of the present invention to minimize the noise and vibration effects of a cryocooler in an MRI superconducting magnet.

It is a further object of the present invention to tune the isolation frequency of the cryocooler to be below the first critical resonant frequency of the magnet.

It is another object of the invention to reduce cryocooler vibration force transmission without affecting the thermal performance of the cryocooler.

In accordance with one form of the present invention isolation means are provided in an MRI superconducting magnet to minimize the vibration effects of the cryocooler. The isolation means include a flexible bellows between the cryocooler and the superconducting magnet plus vibration damping means. The vibration isolation means also includes a mass which is attached to the cryocooler with rods which extend parallel to the axis of the cryocooler with the mass being positioned at a distance from the cryocooler. The dimensions of the rods are selected to lower the stiffness of the vibration in directions other than the axial direction while providing high stiffness in the axial direction. The flexible isolating means includes a bellows interposed between the cryocooler and the vessel enclosing the superconducting magnet and a plurality of elastomeric blocks to dampen motion of the cryocooler. Thermal braids of copper wire thermally connect yet isolate the thermal shields of the MRI from the vibration effects of the cryocooler.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanied drawings in which like characters represent like parts throughout the drawings, and in which:

FIG. 3 is an enlarged view of a portion of FIG. 1 showing details of the bellows motion limiter.

DETAILED DESCRIPTION OF THE INVENTION

Figure 1:
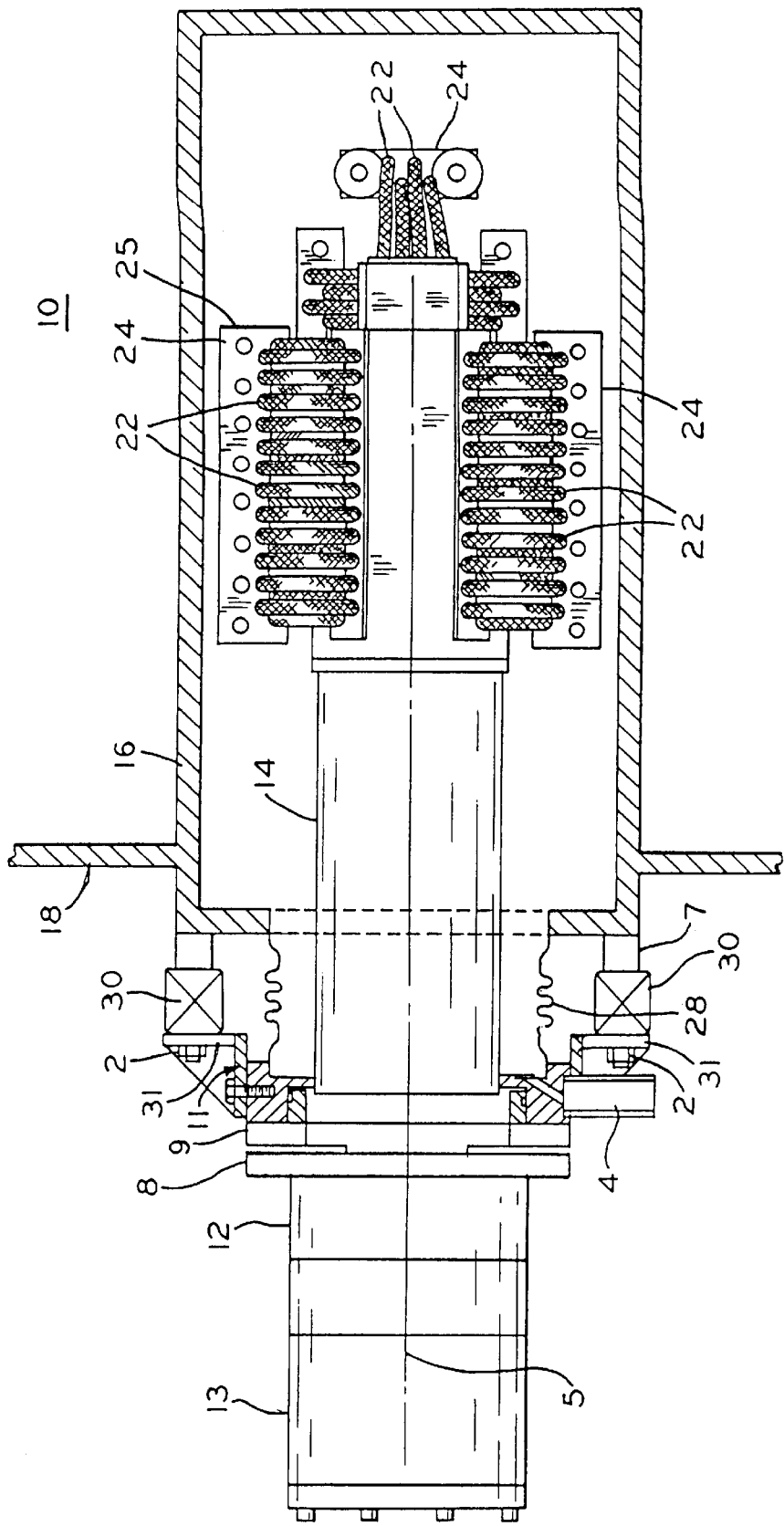
FIG. 1 shows a cross section of an enlarged portion of the invention showing the cryocooler mounted on an MRI superconducting magnet.
Figure 2:
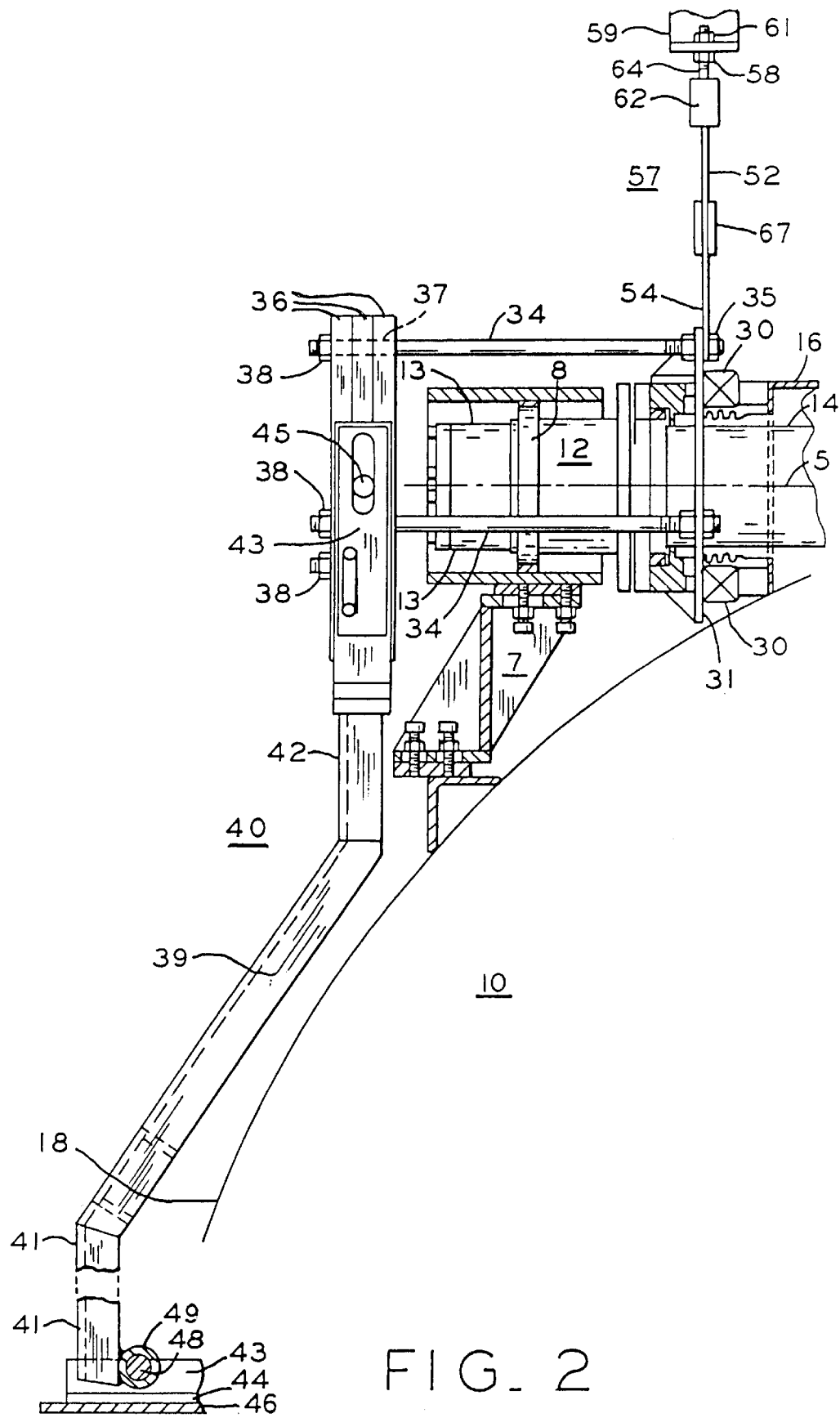
FIG. 2 is a view of the invention better illustrating certain detailed not included in FIG. 1.

Referring to FIGS. 1 and 2, cryocooler 12 is mounted on superconducting magnet 10 and is a powered by drive motor 13 to provide cooling to components within the superconducting magnet. Cryocooler 12 is inserted into a cavity or vacuum sleeve 14 within vacuum vessel 18 of superconducting magnet 10 and secured in place enabling the selective insertion of the cryocooler into the sleeve, or the removal of the cryocooler for service or replacement, without disturbing the vacuum within the vacuum vessel or the superconducting operation of superconducting magnet 10. Cryocooler 12 is bolted to vacuum vessel 18 through suitable mounting means which include member 7, bolts 2, aluminum isolator brackets 31 sized for stiffness, and associated flanges such as cryocooler flange 8, transition flange 9 and stainless steel sleeve 11. Stiffness as used herein is resistance to a static load wherein stiffness is proportional to the force applied divided by the amount of deflection. Accordingly, the lower the deflection, the higher the stiffness.

In accordance with the present invention means are provided to isolate superconducting magnet 10 from the vibration generated by the reciprocating piston and gas motion of cryocooler 12 and to minimize the bothersome noise generated by the cryocooler. Principal elements of the isolating means, each of which are described in more detail below, cooperate to provide the desired vibration attenuation and noise minimization include thermal braids 22, bellows 28, elastomeric blocks 30 and mass 36 (shown in FIG. 2).

Bellows 28 provide vibration isolation between vacuum vessel 18 and cryocooler 12. Bellows 28 provide increased absorbent resiliency or softness in the direction of axis 5 of cryocooler 12 which is also the axis of the motion of the gas piston (not shown) within the cryocooler and hence the direction of movement of the gas piston which creates the mechanical disturbance or vibration of concern. Bellows 28 consists of 2–6 convolutions and is fabricated of 300 series stainless steel having a wall thickness of 5–20 mils, an inside diameter of 5–8 inches and an outside diameter of 6–9 inches. The embodiment shown in FIG. 1 includes three convolutions of substantially sinusoidal shape, although other shapes are suitable. The desired resiliency and softness in the axial direction provided by bellows 28 does not provide adequate support for cryocooler 12 which has a typical weight of approximately 30 pounds, and which with the added sleeve and mounting hardware can be as much as 60 pounds. Bellows 28 is too soft or flimsy to support such significant weight which would tend to cause cryocooler 12 to tip and rotate about the bellows transverse to axis 5. To prevent such rotation or tipping, 3 to 12 elastomeric cylindrical blocks 30 are spaced concentrically around axis 5 and interposed between flanges 8, 9 and 11 together with associated mounting bracket 31 and member or mounting means 7 on vacuum vessel 18 on the other side. Elastomeric blocks 30 have a diameter of ½–2 inches and are selected to provide the desired stiffness and damping (resistance to velocity) to assist in the vibration isolation. They are equally spaced around axis 5. Elastomeric blocks 30 include metal studs embedded therein on each end to facilitate securing them to the cryocooler assembly. Elastomeric blocks 30 support and prevent the rotation of cryocooler 12 and cryocooler sleeve 14 within vacuum vessel 18. Port 4 is a path for pumping out or evacuating sleeve 14 or for access to the vacuum vessel for instrumentation. Elastomeric blocks 30 are neoprene such as those sold by Barry Controls, Brighton, Mass., under their model designation A34-141. Bellows 28 and elastomeric blocks 30 provide vibration isolation without additional vibration paths and result in improved MRI image quality.

However, there is still room for further improvements including the desire to avoid shaking and noise problems. MRI patients have frequently complained about the acoustic noise generated by cryocooler 12. Proximity to the cryocooler for extended periods of time has proved to be a problem. As a result it is desirable to provide an isolation system in which the resonant isolation frequency of cryocooler 12 is below that of vacuum vessel 18. Vibration systems attenuate those frequencies about that of the vibration isolation system while lower frequencies propagate more readily through the isolation system. In a typical installation it was found that vacuum vessel 18 exhibited vibration which was most pronounced at low resonant frequencies of 20–24 cycles per second or 20–24 hertz. As a result, it is desirable to have the vibration isolation effective below 20 hertz. This might normally be accomplished by making the vibration isolation softer, however softening the vibration isolation results in increased displacement or movement of cryocooler 12 during vibration, and such increased motion is transmitted through thermal braids 22 to thermal or heat shield 25 causing increased problems in vibration isolation of the thermal shield. Thermal braids 22 and the isolation provided between cryocooler sleeve 16 and thermal shield 25 is described in some detail in the aforementioned U.S. Pat. No. 5,317,879. In the present combination, the braids are lengthened to accommodate the added motion of cryocooler 12 resulting from bellows 28.

As becomes apparent from the above discussion, the interaction and contribution of the various vibration isolation members presents a plurality of related and interacting vibration problems which must be balanced to obtain an optimum cooperating solution.

In order to isolate the vibration problems along axis 5 of cryocooler 12 and increase the inertial resistance and hence decrease the magnitude of vibrations of cryocooler 12 in that direction (but not in other, including transverse, directions) the inertia mounting or mass arrangement shown in FIG. 2 is added to the vibration isolation combination including thermal braids 22, elastomeric blocks 30 and bellows 28. Referring to FIG. 2, the one embodiment of mass 36 comprises 3 square 12 inch brass ¾ inch thick plates totaling 100 pounds which is suspended about axis 5 and spaced from cryocooler 12 and its drive motor 13 by three rods 34. Alternate mass embodiments are possible. Rods 34 are 18SST stainless steel ¼ to ¾ inches in diameter. A diameter of 5⁄16" was used in one embodiment. The three rods 34 extend parallel to axis 5 of cryocooler 12 and are concentric thereto, being equally spaced from each other about axis 5 by approximately 120 degrees. Rods 34 are secured at their inner ends to mounting plates 31 by suitable fastener such as nuts 35. The outer ends of rods 34 are similarly threaded and nuts 38 secure plates 36 to the rods which pass through appropriately spaced apertures 37 in the plates. Plates 36 are secured to base 44 of superconducting magnet 10 which supports the superconducting magnet on substrate or floor 46 by frame assembly 40 which snakes around vacuum vessel 18 and includes aluminum yoke 43, upper vertical supports 42, upper angle portion 39 and vertical lower portion 41.

Rods 34 are concentric about axis 5 to avoid twisting and provide softness or flexibility in directions other than the axial direction. The rods are not compressible and are stiff in the axial direction. As a result, they provide stiff inertial resistance in the axial direction, while providing soft vibration isolation in the lateral directions. Frame 40 supports the weight of plates 36 in the vertical direction. As a result, frame 40 supports the weight such that its inertia only affects the vibration of cryocooler 12 in the axial direction.

Interposed between frame 40 and plates 36 is U-shaped yoke 43 which surrounds the lower portion of the plates and is connected to the plates by pivots 45. Pivots 45 are a pair of ¾ inch bolts. Yoke 43 provides a support interface between the pivots and frame 40. Pivots 45 enable the adjustment of plates 36 by nuts 38 to provide the optimum positioning and inertia properties of the plates on the vibration isolation system. The bottom of vibration isolation frame 40 is connected to base 44 of superconducting magnet 10 through pivot 49 which is a 2 inch pipe rotatable about axle 48 secured to members 18. Frame 40 is fabricated of 1 to 2 inch thick aluminum channel members sized for the desired stiffness.

It has been found that the overall combination of vibration isolation devices described above not only dampens and isolates vibrations produced by cryocooler 12, but also drastically reduces noise produced by cryocooler 12 which has proved to be extremely irritating to patients, and operators, of the MRI equipment. The present invention has proved to effectively isolate vacuum vessel 18 and thermal shield 25 from the vibrations of cryocooler 12 and has greatly decreased the effects of cryocooler vibration. This has greatly reduced the eddy currents and magnetic field disturbances within superconducting magnet 10 which would otherwise result from vibrations of vacuum vessel 18.

Mobile MRI equipment is utilized for movement over roads for sequential use at a plurality of hospitals or diagnostic centers. For such installations the present invention provides flexibility to compensate for the mobile environment and to avoid bellows fatique which might otherwise result from the bumps and shocks encountered in repeated travel over roadways. Stiffness elements are added along the lateral axes to resist dynamic loads without deforming the bellows or buckling under road conditions. The stiffness is obtained by adding flexures between mounting bracket 31 and vacuum vessel 18. The flexures are sized to resist lateral motion of bellows 28 without adding stiffness along axis 5.

In addition, for mobile MRI applications a motion limiter is provided to limit axial movement of bellows 28 during transportation. The axial motion limiter is shown in FIG. 3.

Referring first to FIG. 3, axial motion limiter 50 includes a threaded ¼ to ½ inch diameter stud 52 extending through aperture 54 in isolation bracket 31 on one end and retained in block 56 secured to vacuum vessel 18 on the other end by threads in the block and lock nut 58. Nut pairs 60, 62 and 64, 66 threaded on stud 52 on opposite sides of isolation bracket to stop plate 31 are positioned by rotation to define the limits of axial travel of bellows 28 secured between vacuum sleeve 16 on one end and isolation bracket 31 (through the intermediary of member 70) on the other end. The distance between nut pairs 60, 62 and 64, 66 defines the amount of motion allowed by axial motion limiter 50 in the direction parallel to axis 5 of cryocooler 12 (see FIG. 1). Other mechanical stops as well as impact absorbers could be used in place of the nut pairs.

A bellows flexure is also desirable in transporting superconducting magnet 10 and for magnets in mobile MRI equipment. FIG. 2 also includes bellows flexures 57 drawn in enlarged form to better illustrate its structure. Referring to FIG. 2, flexure sheet 52 is stainless steel sheet, approximately 4–8 inches long, ½–2 inches wide and 20–90 mils thick. Stiffness element 67 is a pair of plastic members approximately 1–3 inches long, ½–2 inches wide and 1/16–¼ inch thick sandwiching flexure sheet 52 in the central region thereof. Flexure sheet 52 is secured to mounting bracket 31 at end 54 and to end member 62 at the remote end. End member 62 is secured through threaded rod 64 to bracket 59 by nuts 58 and 61 which are positioned on threaded rod 64 on either side of bracket 59 enabling selecting application of controlled tension to flexure sheet 52.

Bellows flexures 57 provides stiffness along its excitation axis parallel to axis 5 of cryocooler 12 of approximately 66 pounds per inch, and approximately 100,000 pounds per inch along each lateral axis. The buckling load is approximately 100 pounds along each lateral axis or 5 G's for a 60 pound load of cryocooler 12 and associate weight, far above anything to be encountered in transporting superconducting magnet 10. The bending load on flexure movement of cryocooler 12 is also adequate. As a result, bellows flexures 57 is adequate to prevent bellows fatigue under a mobile environment, including a mobile MRI installation which is repeatedly moved between a plurality of locations. Bellows flexures 57 is not disconnected during fixed MRI operation at any particular location even through its presence may not be required during such periods of time.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. In an MRI superconducting magnet assembly including a superconducting magnet and a mechanical cryocooler encircling an axis and mounted on said superconducting magnet in heat exchange relationship, an isolation assembly to minimize vibration effects of said cryocooler comprising:

said isolation assembly including flexible isolating means interposed between said cryocooler and said superconducting magnet; and a weight attached along the axis of said cryocooler at a distance from the end of said cryocooler remote from said superconducting magnet such that said cryocooler is positioned intermediate said means and said magnet;

a plurality of axial support members extending substantially parallel to said axis to support said mass;

wherein the magnitude of vibration of said cryocooler in the axial direction is decreased.

2. The MRI magnet assembly of claim 1 wherein a support member extends substantially perpendicular to said axis to support said mass in said perpendicular direction.

3. The MRI magnet assembly of claim 2 wherein said axial support members are rods with dimensions selected to lower the stiffness of the vibration isolation means in directions other than the axial direction while raising the stiffness in the axial direction.

4. The MRI magnet assembly of claim 3 wherein said superconducting magnet includes an enclosing vessel and said flexible isolating means includes a bellows interposed between said cryocooler and the enclosing vessel.

5. The MRI magnet assembly of claim 4 wherein said flexible isolating means further includes at least one elastomeric member between said cryocooler and said superconducting magnet.

6. The MRI magnet assembly of claim 5 wherein said at least one elastomeric member is a plurality of elastomeric block spaced about the axis of said cryocooler.

7. The MRI magnet assembly of claim 5 wherein said cryocooler is positioned within a sleeve in said enclosing vessel and said superconducting magnet includes a plurality of thermal shields within said enclosing vessel, and a plurality of thermally conductive members are interposed between said cryocooler sleeve and at least one of said thermal shields.

8. The MRI magnet assembly of claim 7 wherein said plurality of thermally conductive members are bundles of copper wires selected to provide the desired stiffness and vibration isolation.

9. The MRI magnet assembly of claim 3 wherein the material and dimensions of said isolation means including said inertial means is selected to reduce the isolation frequency of said cryocooler below the first resonant frequency of said enclosing vessel.

10. The MRI magnet assembly of claim 9 wherein said means are brass plates attached to stainless steel rods.

11. The MRI magnet assembly of claim 10 wherein said rods are approximately ¼ to ¾ inches in diameter and approximately 12–24 inches long.

12. The MRI magnet assembly of claim 7 wherein said sleeve enables selectively inserting said cryocooler without disrupting the vacuum in said vacuum vessel, and said bellows in interposed between said cryocooler sleeve and said vacuum vessel.

13. The MRI magnet assembly of claim 12 wherein said bellows concentrically surrounds a portion of said cryocooler and includes 2 to 6 convolutions to provide flexible softness in the axial direction.

14. The MRI magnet assembly of claim 13 wherein said elastomeric means are provided between said cryocooler sleeve and said vacuum vessel to prevent tipping of said sleeve about said cryocooler axis and to provide damping.

15. The MRI magnet assembly of claim 4 wherein an adjustable motion limiter is provided to limit movement of said bellows in the direction of said cryocooler axis.

16. The MRI magnet assembly of claim 15 wherein said motion limiter includes a threaded stud secured between said vacuum sleeve and said cryocooler in parallel with said bellows.

17. The MRI magnet assembly of claim 16 wherein nut pairs threaded on either side of a stop plate selectively define the adjustable amount of motion permitted for said bellows.

18. The MRI magnet assembly of claim 4 wherein lateral stiffness is provided to limit motion of said bellows in directions other than said cryocooler axis.

19. The MRI magnet assembly of claim 18 wherein said lateral stiffness includes flexures attached between said cryocooler and said enclosing vessel.

* * * * *